United States Patent
Dentinger

(12) 
(10) Patent No.: US 6,921,630 B2
(45) Date of Patent: Jul. 26, 2005

(54) PHOTORESIST SUBSTRATE HAVING ROBUST ADHESION

(75) Inventor: Paul M. Dentinger, Sunol, CA (US)

(73) Assignee: Sandia National Laboratories, Livermore, CA (US)

(*) Notice: Subject to any disclaimer, the term of this patent is extended or adjusted under 35 U.S.C. 154(b) by 364 days.

(21) Appl. No.: 10/285,060

(22) Filed: Oct. 31, 2002

(65) Prior Publication Data

US 2004/0086805 A1 May 6, 2004

(51) Int. Cl.⁷ .............................................. G03F 7/00
(52) U.S. Cl. ..................... 430/322; 430/324; 264/401
(58) Field of Search ............................... 430/322, 324; 118/67; 264/401; 205/67

(56) References Cited

U.S. PATENT DOCUMENTS 5,153,709 A * 10/1992 Fukuoka ..................... 257/704
6,607,305 B2 * 8/2003 Fischer et al. ................ 385/57

OTHER PUBLICATIONS

" An Investigation of SU–8 Resist adhesion in Deep X–ray Lithography of High Aspect ratio Structures"; R.L.Barber et al.; SPIE, v5276, (2004),pp 85–91.*

"Fabrications of high–aspect ratio microstructures on metallic substrates using SU–8 resist"; Liu Jingquan et al.; SPIE, v4601, (2001), pp 200–204.*

" Embedded Solenoid inductor CMOS Power Amplifier"; Y–K Yoon et al.; 11 th Intl.Conf. on Solid State and A' transducers, '01 Eurosensors XV, v2 (2001);pp. 1114–1117.*

* cited by examiner

Primary Examiner—Mark F. Huff
Assistant Examiner—Kripa Sagar
(74) Attorney, Agent, or Firm—Donald A. Nissen

(57) ABSTRACT

A substrate material for LIGA applications w hose general composition is $Ti/Cu/Ti/SiO_2$. The $SiO_2$ is preferably applied to the Ti/Cu/Ti wafer as a sputtered coating, typically about 100 nm thick. This substrate composition provides improved adhesion for epoxy-based photoresist materials, and particularly the photoresist material SU-8.

7 Claims, 1 Drawing Sheet

PHOTORESIST SUBSTRATE HAVING ROBUST ADHESION

STATEMENT OF GOVERNMENT INTEREST

This invention was made with Government support under contract no. DE-AC04-94AL85000 awarded by the U. S. Department of Energy to Sandia Corporation. The Government has certain rights in the invention.

CROSS-REFERENCE TO RELATED APPLICATIONS

Not applicable.

FIELD OF THE INVENTION

The invention is directed to a photoresist substrate material that provides for superior adhesion of a photoresist material. The substrate material is particularly useful for improving the adhesion of epoxy-based photoresist materials typically used in LIGA processes.

BACKGROUND OF THE INVENTION

Very high aspect ratio micro-electromechanical structures can be formed by the LIGA process. LIGA is a German acronym for the process steps of deep-etch x-ray lithography (LI), electroforming (G) and molding (A). In this process a layer of photoresist, typically about 0.05 to 2 mm thick, is deposited onto a metallic substrate or plating base, the photoresist is patterned by exposure to x-rays through a mask. Irradiated or unirradiated regions of the resist, depending on the type of photoresist used, are dissolved away by a developer solution to form a process mold. Electroplating using the conductive substrate as a cathode produces a complementary microstructure pattern. The remaining photoresist is dissolved leaving a patterned metal structure as the result.

LIGA process molds can be prepared using phenol-formaldehyde based photoresist materials and particularly the photoresist material designated SU-8. SU-8 is comprised of oligomers of phenol-formaldehyde (novolac) that have been quantitatively protected with glycidyl ether and w hose average epoxy functionality is 8. The photoresist is typically spun on substrates consisting of 75 nm Ti/400 nm Cu/75 nm Ti. However, for photoresist thicknesses useful for LIGA applications, typically greater than about 50–100 $\mu$m thick, the photoresist is prone to delaminate from the substrate either during development or subsequent electrodeposition stepd due to lack of adhesion between the photoresist and the substrate.

In an attempt to overcome the problem of lack of adhesion of epoxy-based photoresist materials to Ti/Cu/Ti substrates, and particularly SU-8 delamination, a wide variety of different coatings were examined by the inventor. Among the coatings tried were Cu, $Si_3N_4$, spin-on glass, hard baked novolac, and a polyimide bottom anti-reflecting coating. None were successful. Polymeric adhesion layers of crosslinked SU-8 and SU-8-like materials proved to be only sporadically successful. Successful repeated adhesion with these materials could not be correlated with any obvious experimental parameter. While the polymeric adhesion material bonded well with SU-8 it did not adhere to the Ti layer of the Ti/Cu/Ti substrate. The addition of Ti-based coupling agents to the polymeric adhesion layer composition or to the substrate itself also proved to be an unsatisfactory solution.

SUMMARY OF THE INVENTION

Accordingly, the present invention is directed to a novel photoresist substrate material, particularly suited for LIGA applications, whose general composition is $Ti/Cu/Ti/SiO_2$, wherein the $SiO_2$ layer is preferably produced by sputtering. This substrate composition has been shown to eliminate the problem of delamination of thick layers of epoxy-based photoresist materials, and particularly delamination of the photoresist material SU-8, and further provides for the use of SU-8 photoresist coatings that can be up to 1000 $\mu$m thick.

BRIEF DESCRIPTION OF THE DRAWINGS

The accompanying drawings, which are incorporated in and form part of the specification, illustrate the present invention and, together with the description, explain the invention. In the drawings, like elements with like functions are referred to by like numbers.

DETAILED DESCRIPTION OF THE INVENTION

Phenol-formaldehyde based photoresist materials, and particularly the photoresist material SU-8, commonly used for LIGA processes, exhibit a tendency to delaminate from the Ti/Cu/Ti substrates conventionally employed, especially for photoresist thicknesses of particular interest for LIGA applications, i.e., greater than about 50 $\mu$m. The present invention is directed to a substrate composition that eliminates the problem of photoresist delamination generally and SU-8 delamination in particular and allows for subsequent electrodeposition steps. It should be noted that throughout the written description of the invention the notation Ti/Cu/Ti refers to a material comprised of three separate and substantially distinct superposed layers, a first layer of Ti, typically about 75 nm thick, a second layer of Cu, typically about 400 nm thick, disposed thereon, and a third layer of Ti, typically about 75 nm thick, disposed on the Cu layer. Although the structure of the Ti/Cu/Ti material is described as a layered structure, there may be some interdiffusion between layers such that a distinct separation between layers is not apparent. The notation $Ti/Cu/Ti/SiO_2$ thus refers to a layer of $SiO_2$ disposed on the uppermost Ti layer The inventor had noted that phenol-formaldehyde based photoresist materials, and particularly the photoresist material SU-8 commonly used for LIGA applications, appeared to adhere well Si-based substrates. Therefore, a series of Ti/Cu/Ti substrate compositions was prepared, wherein the substrate compositions were prepared by coating with a layer of sputtered $SiO_2$ ranging in thickness from 5 to 1400 nm. Adhesion of the SU-8 photoresist to these substrate compositions was tested, as were substrate compositions including Cu, $Si_3N_4$, spin-on glass, hard baked novolac, and a polyimide bottom anti-reflecting coating, by a stress test. The stress test consisted of immersing the photoresist-coated substrates into either boiling water, or ice water, or a combination thereof for about two minutes. While satisfactory adhesion of the SU-8 coated $Ti/Cu/Ti/SiO_2$ substrates was found for all the thicknesses of $SiO_2$ tested, a coating of 100 nm of $SiO_2$ was preferred. By using the wafer composition disclosed herein the inventor has been able to prepare adherent SU-8 coated $Ti/Cu/Ti/SiO_2$ substrates with thicknesses of SU-8 up to 1000 $\mu$m. Moreover, this particular substrate composition has survived subsequent electroplating and lapping tests. Confirmation was provided by electrodeposition into the molds. While Ti/Cu/Ti substrates were obviously successful, they often had large visual delamination. $Ti/Cu/Ti/SiO_2$ proved repeatable and robust in terms of producing metal parts and showed little or no observable delamination when compared to Ti/Cu/Ti.

Figure 1:
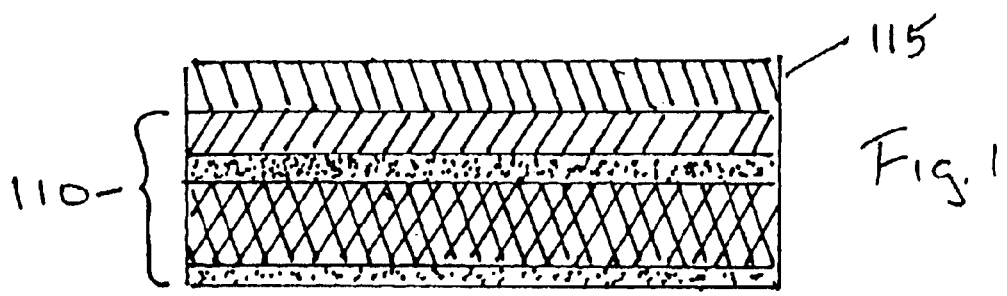
FIGS. 1–4 illustrate the LIGA process incorporating the present invention.
Figure 2:
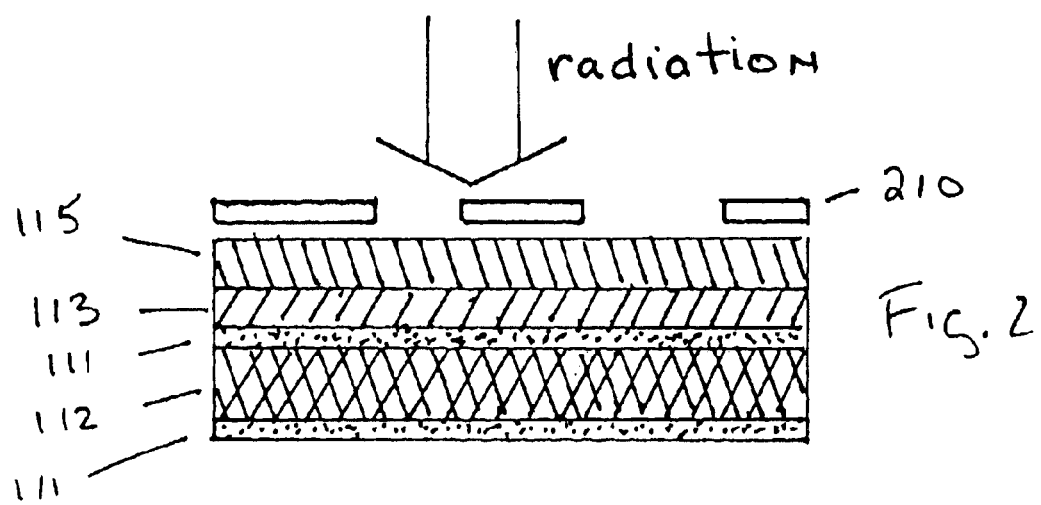
Figure 3:
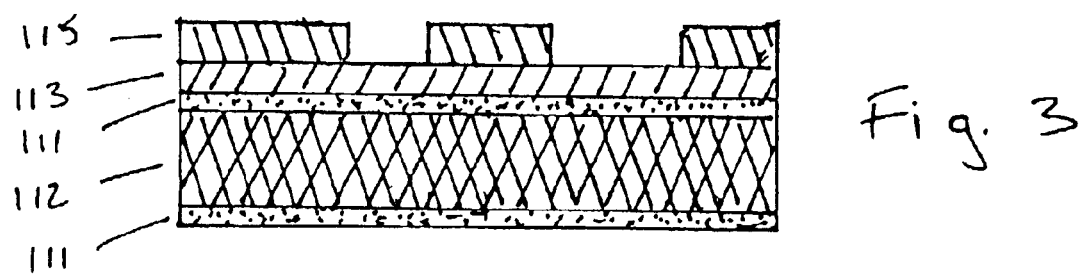
Figure 4:
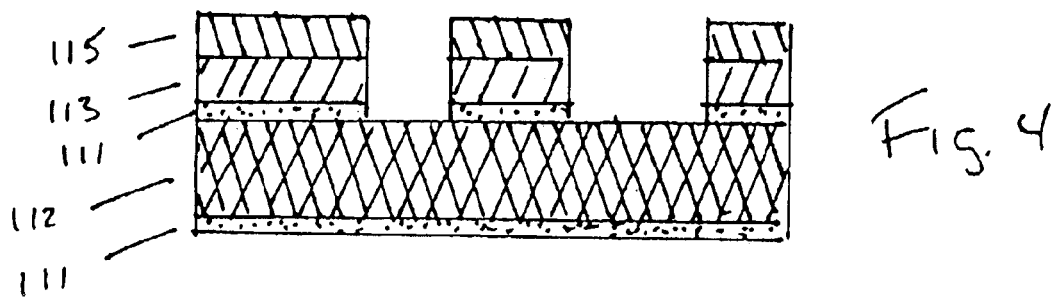

FIGS. 1–4 illustrate, generally, application of the invention to the LIGA process for producing precision micromachined parts discussed above. A layer of photoresist 115 is deposited on substrate 110 comprising superposed layers of Ti 111, Cu, 112, Ti 111, and SiO$_2$ 113, FIG. 1. The photoresist is patterned by methods know n to those skilled in the art, typically by irradiating the surface of the photoresist material by patterned radiation 210, FIG. 2. The patterned photoresist layer is conventionally dissolved to expose the substrate FIG. 3. A subsequent single etch step is employed to etch away both the exposed SiO$_2$ and underlying Ti layers, FIG. 4, in preparation for electroplating. Etching away the Ti layer is necessary since, in contrast to Cu, it is extremely difficult to electroplate directly onto Ti. The use of SiO$_2$ as an adhesion layer for SU-8 is particularly advantageous in that the same etchant (CF$_4$/O$_2$, 80 vol %/20 vol %) can be used for etching away both Ti and SiO$_2$.

We note that the composition Ti/Cu/SiO$_2$ exhibited unsatisfactory photoresist adhesion.

I claim:

1. A photoresist substrate, comprising a layer of SiO$_2$ superposed on a Ti/Cu/Ti substrate.

2. The substrate of claim 1, wherein the photoresist is SU-8.

3. The substrate of claim 1, wherein the thickness of the SiO$_2$ layer ranges from about 25 to about 400 nm.

4. The substrate of claim 3, wherein the thickness is about 100 nm thick.

5. The substrate of claim 1, wherein the SiO$_2$ layer is produced by sputtering.

6. The substrate of claim 5, wherein the sputtered SiO$_2$ layer is about 100 nm thick.

7. A method for producing precision micromachined parts having three-dimensional features, comprising the steps of:
   a) providing a substrate, wherein the substrate has the composition of claim 1;
   b) coating the substrate with a photoresist material;
   c) exposing the photoresist material to patterned radiation;
   d) dissolving potions of the photoresist material to expose the underlying SiO$_2$ layer;
   e) etching the exposed SiO$_2$ layer and the underlying Ti layer in a single etching step;
   f) electroplating; and
   g) dissolving away the remaining photoresist material and SiO$_2$.

* * * * *